(12) United States Patent
Wang et al.

(10) Patent No.: US 9,887,326 B2
(45) Date of Patent: Feb. 6, 2018

(54) QUANTUM DOT COMPOSITE FLUORESCENT PARTICLE AND LED MODULE

(71) Applicant: Tianjin Zhonghuan Quantum Tech Co., Ltd., Tianjin (CN)

(72) Inventors: Kai Wang, Tianjin (CN); Wei Chen, Tianjin (CN); Junjie Hao, Tianjin (CN); Rui Lu, Tianjin (CN); Lei Yang, Tianjin (CN); Dun Bian, Tianjin (CN); Chunfeng Li, Tianjin (CN); Xiaowei Sun, Tianjin (CN)

(73) Assignee: Tianjin Zhonghuan Quantum Tech Co., Ltd., Tianjin (CN)

( * ) Notice: Subject to any disclaimer, the term of this patent is extended or adjusted under 35 U.S.C. 154(b) by 0 days.

(21) Appl. No.: 15/205,282

(22) Filed: Jul. 8, 2016

(65) Prior Publication Data
US 2017/0271562 A1 Sep. 21, 2017

(30) Foreign Application Priority Data
Mar. 21, 2016 (CN) .......................... 2016 1 0161633

(51) Int. Cl.
*H01L 33/00* (2010.01)
*H01L 33/50* (2010.01)
(Continued)

(52) U.S. Cl.
CPC .......... *H01L 33/502* (2013.01); *G02B 6/0055* (2013.01); *G02B 6/0073* (2013.01);
(Continued)

(58) Field of Classification Search
CPC ............... H01L 33/502; H01L 51/5253; H01L 51/5256; H01L 51/5259
See application file for complete search history.

(56) References Cited

U.S. PATENT DOCUMENTS

| 2010/0123155 A1* | 5/2010 | Pickett | ................... | B82Y 15/00 |
|---|---|---|---|---|
| | | | | 257/98 |
| 2015/0072092 A1* | 3/2015 | Seo | ....................... | H01L 33/502 |
| | | | | 428/36.91 |

(Continued)

OTHER PUBLICATIONS

CN102315368.*
Xu et al., Nanoscale Research Letters, 8(1), 73 Feb. 12, 2013.*

*Primary Examiner* — Sonya D McCall Shepard
(74) *Attorney, Agent, or Firm* — Bond, Schoeneck & King, PLLC; William Greener; Erin Phillips

(57) ABSTRACT

The invention discloses a quantum dot composite fluorescent particle including quantum dots, a mesoporous material, and a water-blocking and oxygen-blocking material. The quantum dots are distributed in the mesoporous material, and the water-blocking and oxygen-blocking material is filled in the gaps between the quantum dots and the mesoporous material. The quantum dot composite fluorescent particles may also include metal nanoparticles distributed within the mesoporous material and/or a blocking layer coating the outer surface of the mesoporous material. These features greatly improve the water and oxygen blocking properties and thus, the stability of the quantum dot composite fluorescent particles. The metal nanoparticles help the quantum dots capture more blue lights due to the localized surface resonance plasma and consequently improve the utilization ratio of the blue lights. The quantum dot composite fluorescent particle can then be integrated into an LED module to improve its service life.

15 Claims, 8 Drawing Sheets

(51) Int. Cl.
*F21V 8/00* (2006.01)
*G02F 1/1335* (2006.01)
*H01L 33/56* (2010.01)
*H01L 33/60* (2010.01)
*B82Y 20/00* (2011.01)

(52) U.S. Cl.
CPC .. *G02F 1/133528* (2013.01); *G02F 1/133603* (2013.01); *H01L 33/507* (2013.01); *H01L 33/56* (2013.01); *H01L 33/60* (2013.01); *B82Y 20/00* (2013.01); *Y10S 977/774* (2013.01); *Y10S 977/95* (2013.01)

(56) References Cited

U.S. PATENT DOCUMENTS

| | | | |
|---|---|---|---|
| 2015/0285444 A1* | 10/2015 | Choi | C09K 11/025 362/84 |
| 2016/0004298 A1* | 1/2016 | Mazed | G06F 3/013 345/633 |
| 2016/0342003 A1* | 11/2016 | Takeda | B29D 11/00788 |

* cited by examiner

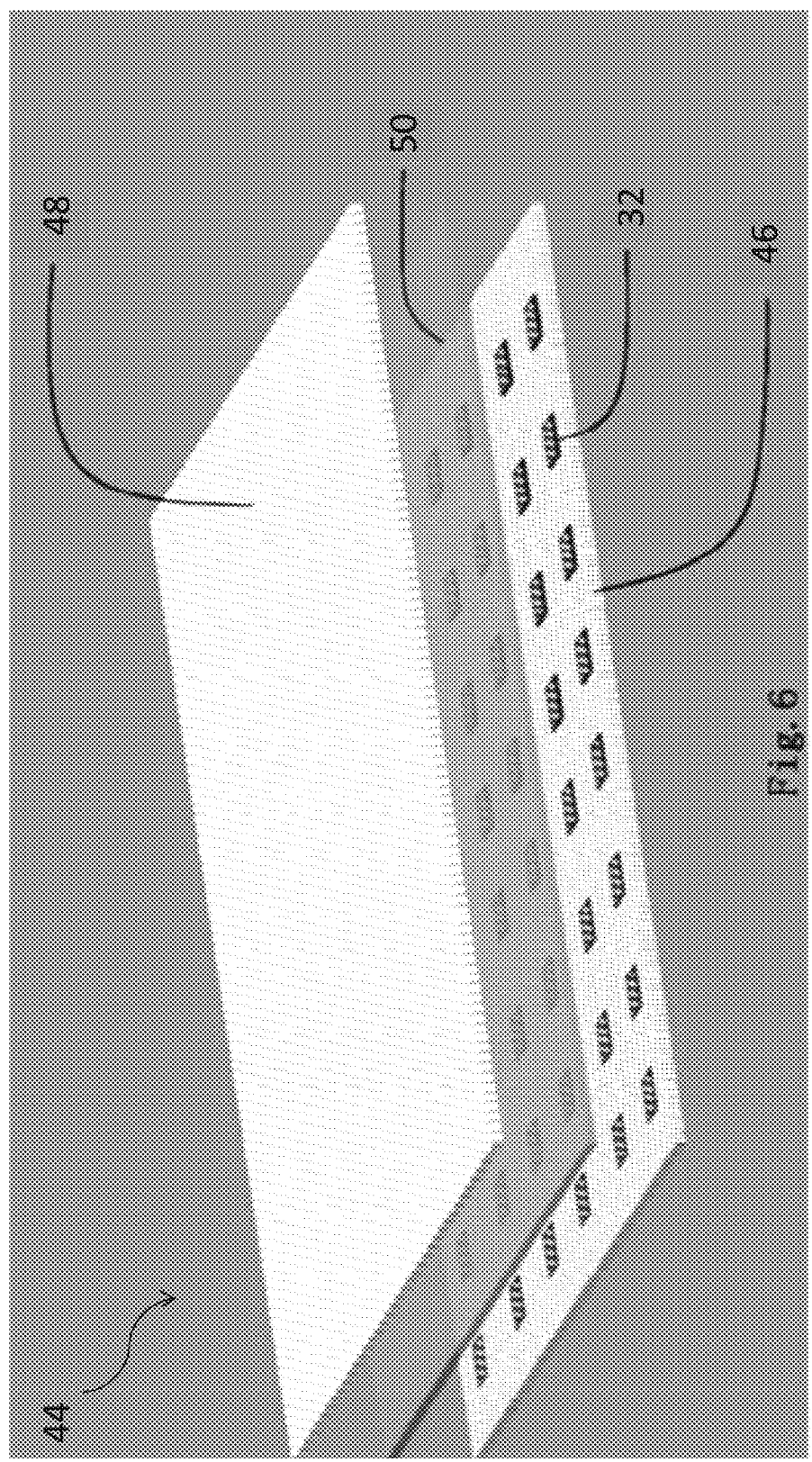

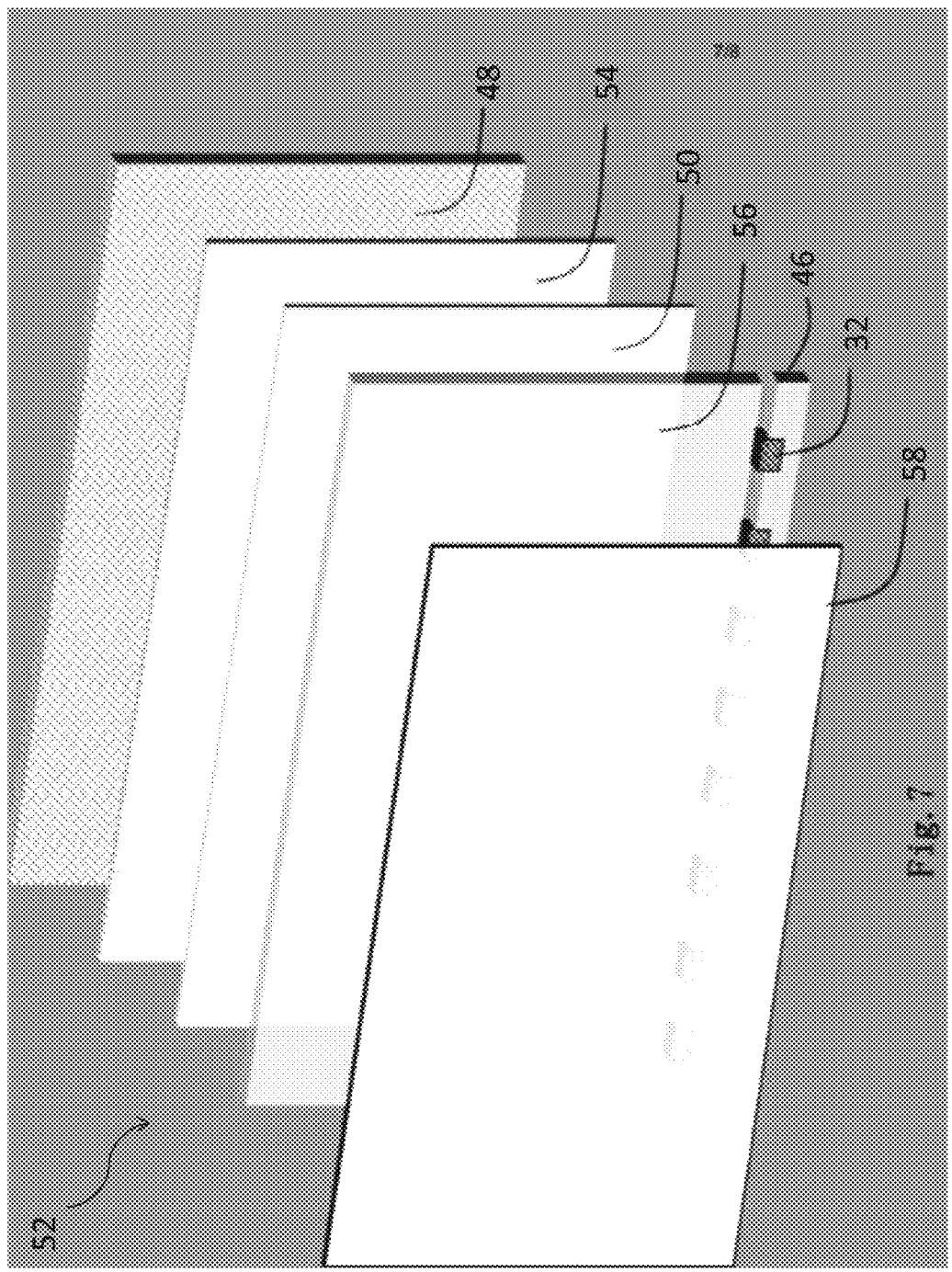

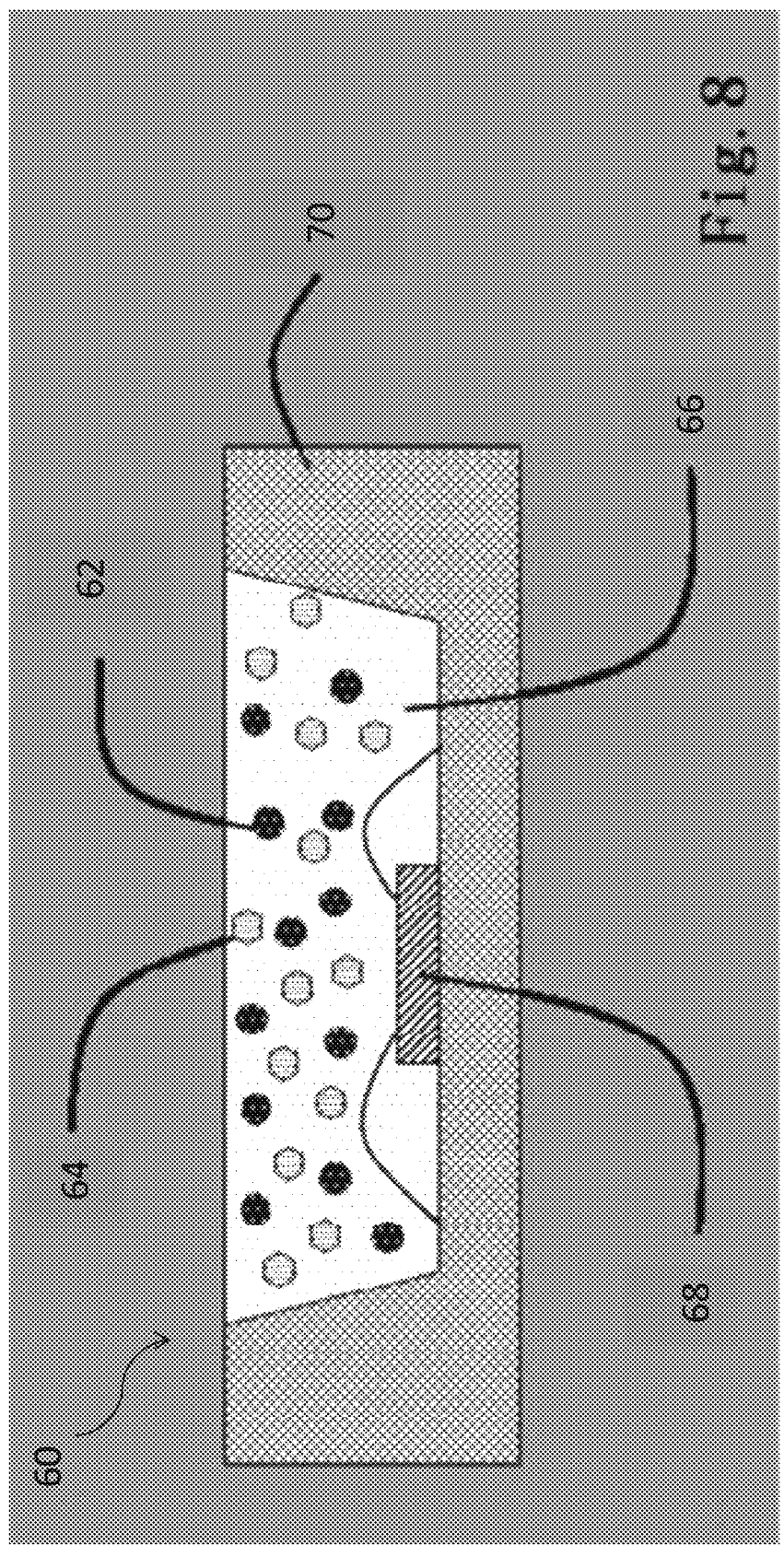

QUANTUM DOT COMPOSITE FLUORESCENT PARTICLE AND LED MODULE

CROSS-REFERENCE TO RELATED APPLICATIONS

The present application claims priority under 35 U.S.C. § 119(b) to and the benefit of Chinese patent application number 201610161633.X, filed on Mar. 21, 2016, the entire content of which are hereby incorporated by reference.

BACKGROUND OF THE INVENTION

1. Field of the Invention

The subject matter disclosed herein relates generally to the field of fluorescent materials and more specifically to an LED module comprising quantum dot composite fluorescent particles.

2. Description of the Related Art

A quantum dot refers to a semiconductor nano-structure that bonds excitons in three spatial directions. Quantum dots can be divided into three categories: a colloidal quantum dot, a self-assembled quantum dot, and an electric field confinement quantum dot. Quantum dots produce multiple unique electrical and optical properties due to the quantum restriction effect of an electron wave function caused by the size of the quantum dot being less than or close to the Bohr radius of the exciton. Therefore, quantum dot technology shows huge potential in disciplines such as biochemistry, cell biology, immunochemistry and the like. It has been applied in lasers, single electron transistors, detectors, biological stains, medical diagnoses, DNA sequence determination and immunoassays, etc.

The quantum dot cannot normally be used directly because it has relatively weak stability in ambient circumstances. The quantum dots may cluster causing fluorescence quenching and energy transfer since the nano-size surface energy is large. Meanwhile, the colloidal layer and surface element, such as S, of the colloidal quantum dot is easily corroded to retain a defect level, form a non-radiative transition channel, and cause fluorescence fading. Most physicochemical environments will cause fluorescence quenching to the quantum dot. Therefore, how to use the quantum dot is presently a hot and critical issue.

During the application process, general practice is to directly disperse the quantum dots into a polymer matrix to obtain a fluorescence composite material and form a simple "quantum dots-matrix materials" structure. The composite material substantially maintains the fluorescence characteristic of the colloidal quantum dot. The composite material can then be directly integrated with a blue LED to obtain white lights, or to obtain a multicolor spectrum converted by the quantum dot, which can be directly applied to displays and lightings, respectively.

Quantum dots are presently used by first dispersing the colloidal quantum dots in silica gel directly through a manner of stirring, then attaching the silica gel on the LED through a manner of dispensing. In the method, red-green quantum dots can be used to obtain blue/green/red white LEDs. Similarly, yellow quantum dots such as $CuInS_2$ series quantum dots can also be used to obtain white LEDs. Additionally, white LEDs can also be obtained by using the quantum dots coated with phosphor powder. However, this method has a compatibility problem between the colloidal quantum dot and the silica gel. Because the surface ligands of the quantum dots are not compatible with the silica gel matrix materials, fluorescence quenching caused by the aggregation of the quantum dots and the peeling off of the surface ligands will usually appear. Meanwhile, the silica gel has poor blocking properties against water and oxygen; therefore, during operation of a quantum dots-related LED device, erosion caused by water and oxygen, particularly under light exposure, causes fluorescence fading of the quantum dot so that the service life of the device is short. Further, the surface of the quantum dot (inorganic layer and organic ligand) contains sulfur which will react with the commercial silica-gel-curing platinum catalyst at present, so that the silica gel cannot be cured.

Another method is to disperse the quantum dots in a polymer material in order to obtain a quantum dot light conversion film, and then seal the film on a blue light chip using remote packaging. Although this method improves the compatibility problem between the quantum dot and the matrix materials, the polymer's ability to block the water and oxygen is still limited. Therefore, during the long term operating period, the quantum dot will still face the erosion problem caused by photooxygenation. In order to solve the problems caused by water and oxygen, a silicon dioxide/polyethylene pyrrolidone material is employed as a remote packaged blocking layer. The invasion of water and oxygen is blocked by providing surface protection on the composite film, and adding a film with better water-blocking and oxygen-blocking capacity in the upper and lower layers, so that the damage on the surface of the quantum dot is reduced. Although this method can block water and oxygen to a certain extent, the ligand wearing and conglobation effects caused by the incompatibility problem between the outer surface of the quantum dot and the matrix cannot be prevented, thus affecting the stability and reliability of a light emitting device. It is worth pointing out that the luminous efficacy of the remote-packed LED is poorer than that of on-chip packing.

Therefore, for the use of quantum dots with high luminous efficiency and high stability in LED devices, the following problems must be resolved. First, the quantum dot must not destroy the quantum efficiency during self-surface treatment or when composited with other materials. Second, the ambient environment of the quantum dot must be compatible with the surface of the quantum dot, thereby preventing the aggregation of the quantum dot and the peeling off of the ligand. Third, a blocking layer must be configured to prevent erosion from molecules like water vapor and oxygen on the surface of the quantum dot.

Chinese patent application number 201510576368 discloses a fluorescent quantum dot micro-nano packaged composite material structure, wherein the composite material structure includes a fluorescent quantum dot, a mesoporous material having a nanometer lattice structure, and a blocking layer. The fluorescent quantum dot is distributed in the mesoporous material, and the blocking layer is coated on the outer surface of the mesoporous material. Although the blocking layer can better block water and oxygen, water and oxygen will still remain in the mesoporous material. Moreover, the coating effect of the blocking layer is far lower than the theoretically expected effect and thus, the blocking effect on the water and oxygen is not ideal. Therefore, it is desirable to improve the prior art to obtain a quantum dot composite material having better water-blocking and oxygen-blocking effects and higher efficiency.

3. Objects and Advantages

It is a principal object and advantage of the present invention to provide a quantum dot composite fluorescent particle having excellent water-blocking and oxygen-blocking effects.

It is a further object and advantage of the present invention to provide an LED device using the quantum dot composite fluorescent particle as a light conversion material.

It is another object and advantage of the present invention to provide water-blocking and oxygen-blocking material that fills the gaps between quantum dots and mesoporous material, so that the matrix materials of the quantum dots are more compact, and the water-blocking and oxygen-blocking characteristics of the quantum dot composite fluorescent particle are greatly improved; therefore, the stability of the quantum dot composite fluorescent particle is improved.

Yet another object and advantage of the present invention is to provide metal nanoparticles that can help the quantum dots capture more blue lights and improve the utilization ratio of the blue lights. During actual production, the use of the quantum dots for obtaining the same light conversion effect can be reduced, thus reducing the use of heavy metal in the quantum dots in order to be more environmentally friendly.

A further object and advantage of the present invention is to provide metal nanoparticles that improve the fluorescence intensity of the quantum dot due to surface plasmas produced by the regular motion of the free electrons of the metal nanoparticles under the action of an external electromagnetic field that can greatly enhance the electromagnetic field surrounding the particles. When the frequency of incident lights is consistent with the natural frequency of the free electrons of the metal nanoparticles, surface plasma resonance is produced, which enhances a local field to maximum while this enhanced local field enhances the excitation rate and the luminous intensity of the quantum dots near the surface of the metal nanoparticles.

It is another object and advantage of the present invention to provide metal nanoparticles that improve the fluorescence intensity of the quantum dot with non-radiative energy transfer that occurs between the quantum dots and the metal nanoparticles during the coupling radiation process of the metal nanoparticles and the quantum dots, and is coupled into LSPR energy by excited quantum dots while the LSPR is radiated to a far field in turn.

Yet another object and advantage of the present invention is to provide a preparation process that employs no chemical machining or chemical treatment, and retains the fluorescence characteristic of the quantum dots, including emission wavelength and fluorescence efficiency, so that the quantum dot composite fluorescent particle has a very high quantum efficiency.

A further object and advantage of the present invention is to provide a quantum dot composite fluorescent particle that has a mesoporous structure, thus greatly reducing the efficiency fading or quenching caused by the aggregation of the quantum dots in fluorescence particles.

It is another object and advantage of the present invention to provide a quantum dot composite fluorescent particle that has a blocking layer structure, which reduces and even completely blocks the quantum dots from being contacted with water and oxygen, thereby improving the service efficiency, enabling the quantum dot composite fluorescent particle and the LED module thereof to have excellent service lives, and allowing the quantum dot composite fluorescent particle to be directly used for commercializing.

An additional object and advantage of the present invention is to provide a quantum dot composite fluorescent particle and LED chip that can be directly packaged in a chip contact manner, which greatly improves the luminous efficacy of the LED.

Yet another object and advantage of the present invention is to provide a quantum dot composite fluorescent particle that is directly prepared to obtain a blue/green/red white LED for displaying and may also be matched with phosphor powder to obtain a white LED for lighting.

Other objects and advantages of the present invention will in part be obvious and in part appear hereinafter.

SUMMARY OF THE INVENTION

The present invention comprises a quantum dot composite fluorescent particle having quantum dots, a mesoporous material, and a water-blocking and oxygen-blocking material. The quantum dots are distributed in the mesoporous material, and the water-blocking and oxygen-blocking material is filled in the gaps between the quantum dots and the mesoporous material. The quantum dot composite fluorescent particle can further include metal nanoparticles distributed in the mesoporous material and/or a blocking layer coating the outer surface of the mesoporous material.

In preparation for creating the quantum dot composite fluorescent particle, the mesoporous aperture of the mesoporous material is matched with the particle size of the quantum dot, so that the quantum dot can be embedded in the mesoporous aperture of the mesoporous material. The quantum dot can then be embedded in the mesoporous material using the three methods as follows. However, the creation of the quantum dot composite fluorescent particle is not limited to the following methods. The first method is a physical method to embed the quantum dot in the mesoporous material through physical swelling and solvent evaporation. The second method involves growing the quantum dot in-situ, i.e., growing the quantum dot in-situ in the mesoporous material. Finally, the third method involves growing the mesoporous material in-situ, i.e., growing the mesoporous material in-situ in a quantum dot solution.

The resulting quantum dot composite particle can be integrated into an LED module. An LED module can include a chip, a silica gel and quantum dot composite fluorescent particles. A method of preparing a white LED for displaying includes mixing quantum dot composite fluorescent particles emitting red lights and those emitting green lights with silica gel, and then coating the silica gel on a blue light chip by stirring, deaerating and dispensing to obtain a white LED. The blue lights emitted by the blue light chip are composited with the green lights emitted by green fluorescence particles and the red lights emitted by red fluorescence particles to obtain blue/green/red tricolor white LED.

A white light bar is obtained from an LED module through a process such as chip mounting. The white light bar is then integrated into a backlit module to obtain a display module. The display module includes a backlit type and a photometric type. A backlit LED display module includes a liquid crystal module, a dodging module and a backlit module, wherein the LED module above-mentioned is integrated in the backlit module. A side-lit LED display module includes a liquid crystal module, a polarizing module, a dodging module, a light guiding module, a backlit module and a reflection layer, wherein the LED module above-mentioned is integrated in the backlit module.

There are two types of white LEDs for lighting, wherein one is a chip-mounting module for lighting, including a blue light chip, yellow phosphor powder, quantum dot composite fluorescent particles emitting red lights, silica gel and a substrate. The other is a high-power LED module for lighting, including a blue light chip, yellow phosphor powder, quantum dot composite fluorescent particles emitting red lights, silica gel, a substrate, a gold thread, a PC lens, pins, or the like.

Another method of preparing white LED for lighting includes mixing quantum dot composite fluorescent particles emitting red lights and universal yellow phosphor powder with silica gel, then coating the silica gel on a blue light chip by stirring, deaerating and dispensing to obtain a white LED. The blue lights emitted by the blue light chip are composited with the yellow lights of the phosphor powder, and the red lights emitted by the red fluorescence particles to obtain white lights with optimized red lights, which can greatly improve the quality, particularly the color rendering index, of the white lights for lighting.

BRIEF DESCRIPTION OF THE DRAWINGS

The present invention will be more fully understood and appreciated by reading the following Detailed Description in conjunction with the accompanying drawings. The accompanying drawings illustrate only typical embodiments of the disclosed subject matter and are therefore not to be considered limiting of its scope, for the disclosed subject matter may admit to other equally effective embodiments.

Reference is now made briefly to the accompanying drawings, in which:

FIG. 6 is a structure diagram of a backlit LED module according to embodiment 4;

FIG. 7 is a structure diagram of a side-lit LED module according to embodiment 5; and FIG. 8 is a structure diagram of a chip-mounting LED according to embodiment 6.

Figure 1:
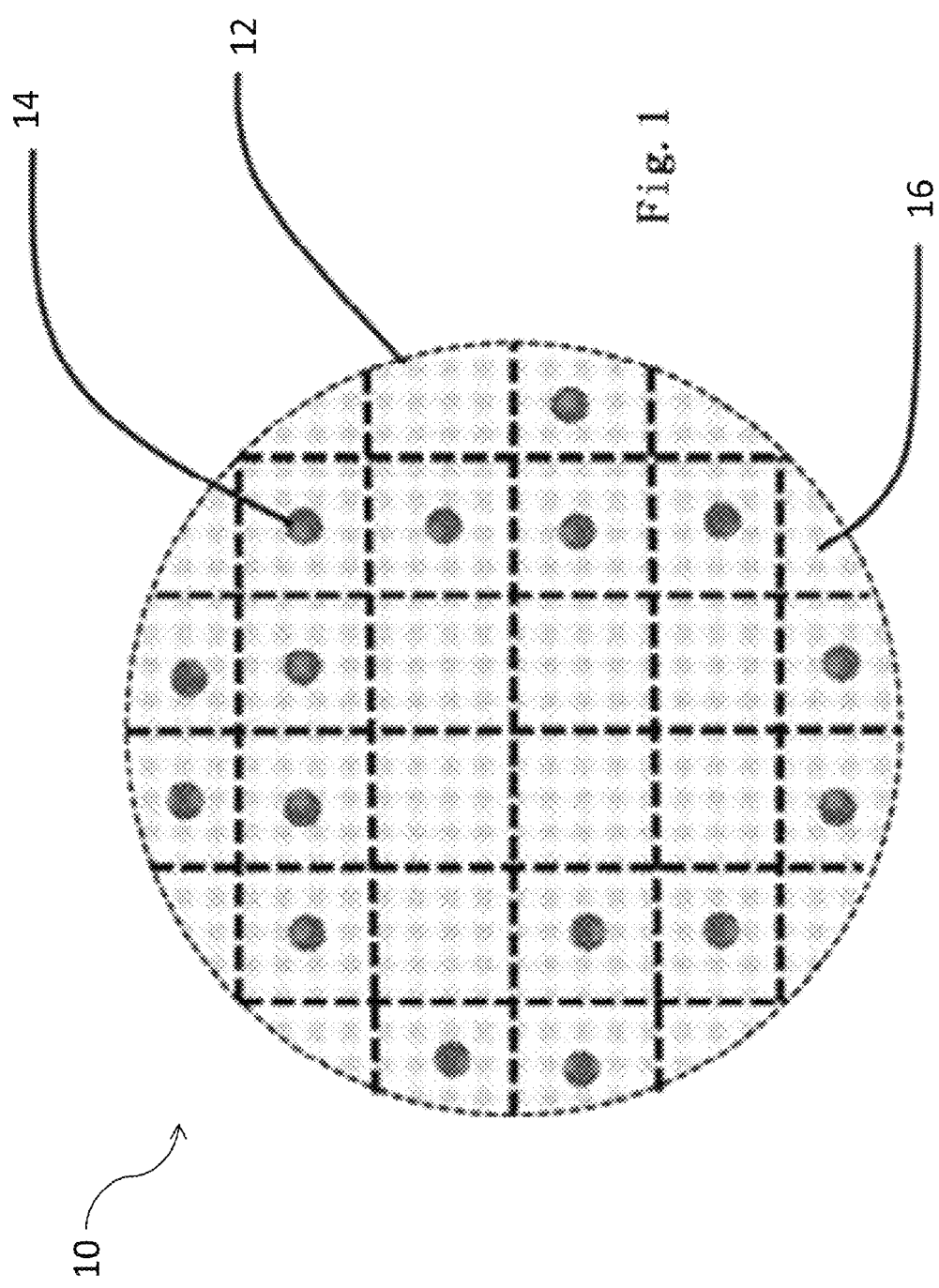
FIG. 1 is a structure diagram of a quantum dot composite fluorescent particle according to embodiment 1.

Where applicable, like reference characters designate identical or corresponding components and units throughout the several views, which are not to scale unless otherwise indicated. Moreover, the embodiments disclosed herein may include elements that appear in one or more of the several views or in combinations of the several views.

DETAILED DESCRIPTION

The present invention will be further described hereinafter with reference to the specific embodiments. All the mass ratios of raw materials, solvent types and dosages, conditions like reaction temperature and time used in the following embodiments can be flexibly adjusted according to the actual requirements, which belong to the conventional technical means of the art.

The present invention comprises a quantum dot composite fluorescent particle having quantum dots, a mesoporous material, and a water-blocking and oxygen-blocking material. The quantum dots are distributed in the mesoporous material, and the water-blocking and oxygen-blocking material is filled in the gaps between the quantum dots and the mesoporous material. The quantum dot composite fluorescent particle can further include metal nanoparticles distributed in the mesoporous material. The metal nanoparticles can form a LSPR effect with the quantum dots. The metal nanoparticles can be, but are not limited to, nano gold, nano silver or nano platinum. Further, the metal nanoparticles can be a round, triangle, square or star shape. However, the metal nanoparticles can be of any shape, wherein the rougher the surface structure is (i.e., the greater the edge angles), the more apparent the surface enhancement effect. The metal nanoparticles can also be replaced by oxides and semiconducting materials. The oxides can include, but are not limited to, tungsten oxide and vanadium oxide, while the semiconducting materials can include, but are not limited to, molybdenum disulfide and molybdenum diselenium.

The water-blocking and oxygen-blocking material is a high polymer. The high polymer is at least one of oxidized polyethylene wax, polyethylene, polystyrene, poly-p-xylylene, polycarbonate and polymethyl methacrylate. Further, the particle size of the mesoporous material is within the range of 0.05-1000 μm and the mesoporous aperture of the mesoporous material is within the range of 2-50 nm. The mesoporous material is a mesoporous silicon dioxide material, a mesoporous titanium dioxide material, a mesoporous zinc dioxide material, a molecular sieve or a metal-organic framework compound. The quantum dot composite fluorescent particle can further include a blocking layer coated on the outer surface of the mesoporous material. The blocking layer can be an oxide dielectric layer or a polymer dielectric layer. The oxide can be silicon dioxide, titanium dioxide or boric oxide while the polymer can be polystyrene or polyimide.

The quantum dot is a crystal material having a size within the range of 2-50 nm. It is generally composed of a core light emitting nanocrystal, an extensional inorganic shell crystal thereof, and a most extensional organic ligand layer. The core light emitting nanocrystal can be selected from any one of a first compound formed by elements in the main group II and the main group VI in the periodic table of elements, any one of a second compound formed by elements in the main group III and the main group V, and combinations of the first compounds and/or the second compounds. The first compounds include: CdSe, CdTe, MgS, MgSe, MgTe, CaS, CaSe, CaTe, SrS, SrSe, SrTe, BaS, BaSe, BaTe, ZnS, ZnSe, ZnTe and CdS. The second compounds include: GaN, GaP, GaAs, InN, InP and InAs. The core light emitting nanocrystal may also be selected from CdSeS, CdZnSe, ZnSeS, $CuInS_2$, $CuInSe_2$, $AgInS_2$, $CdPbX_3$ (X=Cl, Br, I) and the like. The extensional inorganic shell crystal may be CdS, ZnS, ZnSe, CdS/ZnS, CdS/ZnSe, CdZnSe, CdZnS and the like. The organic ligand can be oleic acid, stearic acid, cetylamine, octadecylamine, trioctylphosphine oxide, or the like.

The surface finishing of the inner surface of the mesoporous particle material can be implemented through vacuum calcination and chemical surface treatment, including eliminating hydroxyl radical and other active groups. This increases the compatibility between the fluorescent quantum dot and the mesoporous particle material, and thereby increases the fluorescence stability.

The following embodiments of the present invention describe various quantum dot composite fluorescent particles and the methods for making them. Additional embodiments integrate the quantum dot composite fluorescent particles into an LED module.

Embodiment 1

Referring now to FIG. 1, there is shown a structure diagram of a quantum dot composite fluorescent particle 10 according to a first embodiment. The quantum dot composite fluorescent particle 10 shown in FIG. 1 is prepared via a physical swelling-solvent evaporation method. First, mesoporous silicon dioxide is used as a mesoporous material 12. The particle size of the mesoporous material 12 can be within the range of 30-60 µm, and the mesoporous aperture can be within the range of 7-8 nm. 1 g of mesoporous silica material 12 is dispersed in 100 mL normal hexane. The surface of the mesoporous silica 12 is soaked and activated, then heated and reflowed. The temperature is insulated for 10 hours and ambient inert gas is then added for protection.

Next, CdSe is used as a quantum dot 14 with a mean size of 4-6 nm. 10 mg of quantum dots 14 are dispersed into 10 mL normal hexane. Then, the quantum dot solution is dispersed into the mesoporous silica solution and quickly stirred for 2 hours so that the quantum dots 14 can enter the mesoporous silica 12. A reflowing device is then removed and ambient inert gas is blown in to almost completely volatilize the solution. Next, a new solution is added and the mesoporous silica 12 is turgescent in the heated solution through a manner of continuously changing the concentration. Due to the concentration difference, the quantum dots 14 enter the mesoporous silica 12 effectively. The swelling-solvent evaporation step is repeated for 1-10 hours. After the normal hexane is completely volatilized, the mixture is naturally cooled under the protection of the inert gases. The mixture is then dried in a vacuum drying oven to obtain the quantum dot-mesoporous material powder.

Following the vacuum drying step, 200 mg oxidized polyethylene wax 16 is dispersed into 50 mL methylbenzene and heated until the solids are molten in order to obtain a clear and transparent solution. Finally, the quantum dot-mesoporous material powder obtained in from the vacuum drying step is added into the oxidized polyethylene wax solution and quickly stirred. Due to the concentration difference, the oxidized polyethylene wax 16 will enter the mesoporous material 12 to fill in the gaps between the quantum dots 14 and the mesoporous material 12. After the solvent is completely evaporated, quantum dot composite fluorescent particles 10 are obtained.

The resulting quantum dot composite fluorescent particle 10 is shown in FIG. 1. The structure is as shown in FIG. 1, wherein the quantum dot composite fluorescent particle 10 comprises quantum dots 14, and water-blocking and oxygen-blocking material (oxidized polyethylene wax) (hereinafter "OPE") 16 within mesoporous material (mesoporous silica) 12. Quantum dot composite fluorescent particles without water-blocking and oxygen-blocking material is prepared similarly without the final step of adding OPE.

Figure 2:
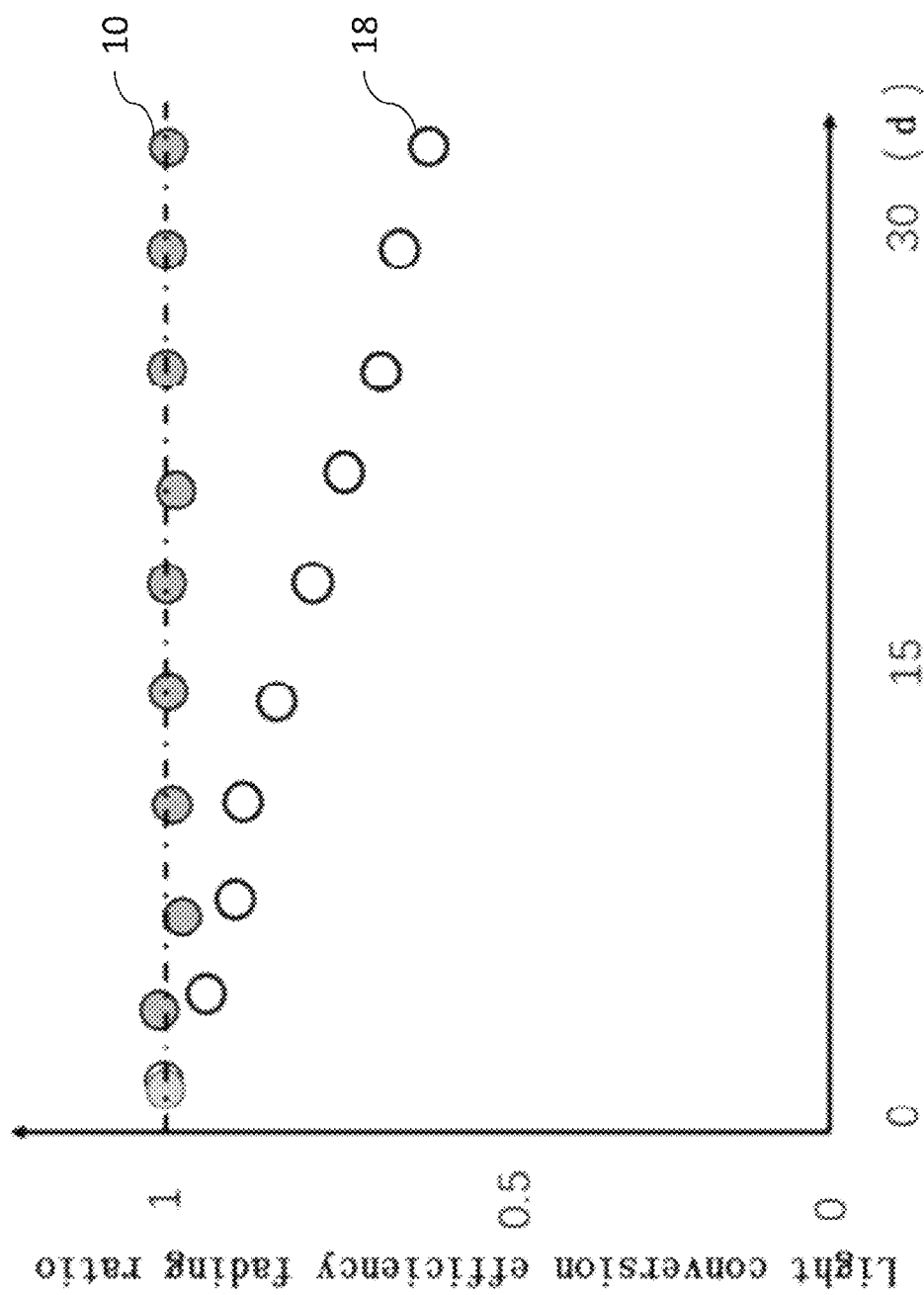
FIG. 2 is a schematic diagram showing the facing of the quantum dot composite fluorescent particle with the lighting time of an LED according to embodiment 1.

When the quantum dot composite fluorescent particle 10 shown in FIG. 1 and the quantum dot composite fluorescent particle without the OPE 18 are integrated into LEDs, the light conversion efficiency fading ratio of the fluorescence particles is as shown in FIG. 2, compared to increasing lighting time measured in days. In FIG. 2, the light conversion efficiency of the fluorescence particles filled in by OPE 10 does not fade substantially in one month, while the light conversion efficiency of the fluorescence particles not filled in by OPE 18 fades gradually, and decreases to about 60% in one month. FIG. 2 shows that the water-blocking and oxygen-blocking characteristics of the quantum dot composite fluorescent particle are improved after filling the spaces between the quantum dots and the mesoporous material with the water-blocking and oxygen-blocking material, so that the stability thereof is improved.

Embodiment 2

The following method describes the preparation of quantum dot fluorescent particles according to a second embodiment. The quantum dot composite fluorescent particle containing metal nanoparticles is prepared using the following method. First, 1 g mesoporous silica and 1 mL triangle nano gold particles are dispersed in 100 mL normal hexane. The surface of the mesoporous silica is soaked and activated, then heated and reflowed. The temperature is insulated for 10 hours and ambient inert gas is then added for protection. Next, a reflowing system is removed to vaporize the solvent in order to obtain white metal-mesoporous silica composite particle powder.

The composite particle powder obtained is calcined under 200° C. and ambient inert gas protection, and then re-dispersed in 50 mL methylbenzene. In the following step, 10 mg of CdSe/ZnS quantum dots having an emission wavelength of 530 nm are dispersed in 10 mL methylbenzene. The quantum dot solution is then dispersed into the metal-mesoporous silica solution and quickly stirred for 2 hours so that the quantum dots can enter the mesoporous silica. The reflowing device is removed and ambient inert gas is blown in to almost completely volatilize the solution. Next, a new solution is added and the mesoporous silica is turgescent in the heated solution through a manner of continuously changing the concentration. The concentration differences allow the quantum dots to enter the mesoporous silica effectively. The swelling-solvent evaporation step is repeated for 1-10 hours. After the normal hexane is completely volatilized, the mixture is naturally cooled under the protection of the inert gases. The mixture is then dried in a vacuum drying oven to obtain the quantum dot-mesoporous material powder.

Following the vacuum drying step, 100 mg of polyethylene is dispersed into 50 mL of chloroform and heated until the solids are molten in order to obtain a clear and transparent solution. The quantum dot-mesoporous material powder obtained in vacuum drying step is added into the polyethylene solution and quickly stirred. Due to the concentration difference, the polyethylene enters the mesoporous material to fill in the gaps between the quantum dots and the mesoporous material. After the solvent is completely evaporated, green quantum dot composite fluorescent particles containing nano gold are obtained.

Figure 3:
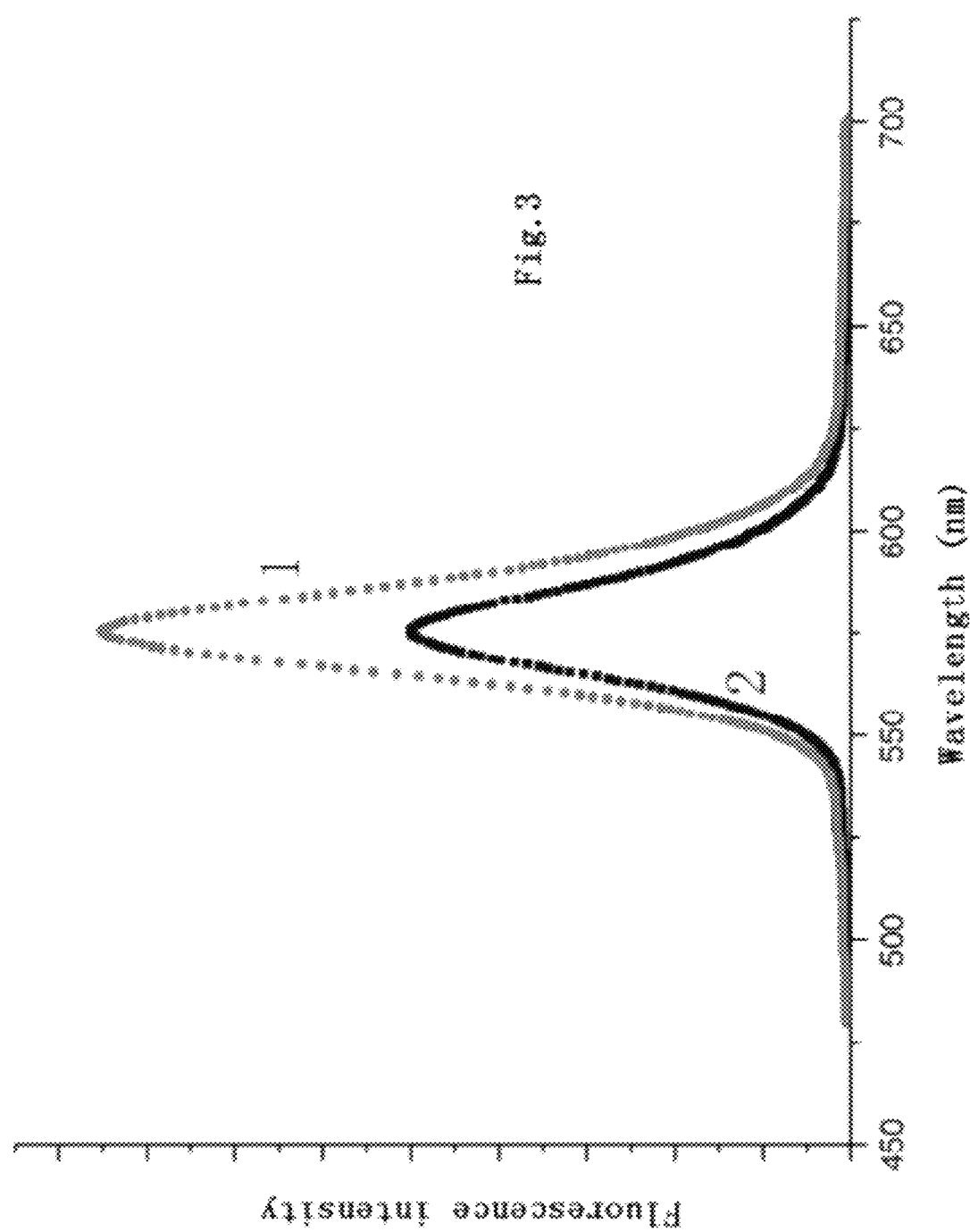
FIG. 3 is a fluorescence intensity curve of a quantum dot composite fluorescent particle according to embodiment 2.
Figure 4:
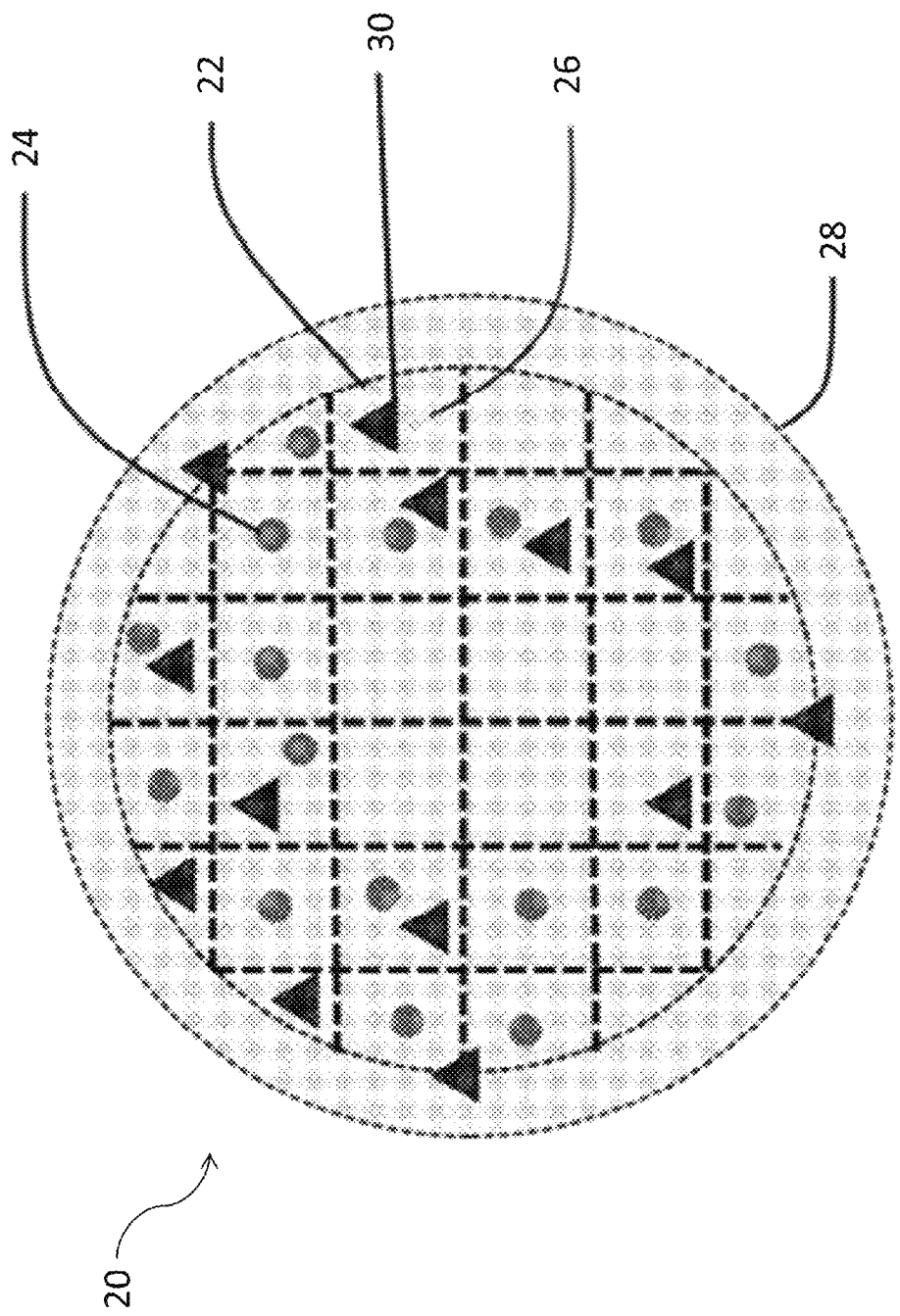
FIG. 4 is a structure diagram of a quantum dot composite fluorescent particle according to embodiment 3.

The resulting quantum dot fluorescent particle is as shown in FIG. 4, but does not include a blocking layer 28. Referring now to FIG. 3, there is shown a fluorescence intensity curve of the quantum dot composite fluorescent particle according to embodiment 2 compared to a fluorescence intensity curve for a quantum dot composite fluorescent particle prepared the same way but without the added nano gold. When the absorption wavelength of the nano gold is matched with the emission wavelength of the quantum dot, and the spacing between the nano gold and the quantum dot is proper, the metal nanoparticles can participate in light emitting through plasma resonance. As shown in FIG. 3, the fluorescence intensity (curve 1) of the fluorescence particles is 1.7 times stronger than that of the fluorescence particle (curve 2) without the added nano gold.

Embodiment 3

Referring now to FIG. 4, there is shown a structure diagram of a quantum dot composite fluorescent particle 20 according to a third embodiment. The quantum dot composite fluorescent particle 20 shown in FIG. 4 contains metal nanoparticles 30 and a blocking layer 28, and is prepared using the following method. First, CdSe/ZnS quantum dots having an emission wavelength of 640 nm are used to obtain a red quantum dot composite fluorescent particle containing nano gold according to the steps in embodiment 2 as described above.

Then, the red quantum dot composite fluorescent particle is re-dispersed in anhydrous alcohol. Next, 99.99% tetraethoxysilane is added and stirred evenly. Aqueous ammonia is dropwise added and quickly stirred thereby hydrolyzing the tetraethoxysilane and growing a silica dielectric layer. In this way, a dot composite fluorescent particle containing metal nanoparticles and blocking layer is obtained.

The resulting quantum dot composite fluorescent particle 20 is shown in FIG. 4. The structure is as shown in FIG. 4, wherein the quantum dot composite fluorescent particle 20 comprises quantum dots 24, metal nanoparticles (nano gold) 30, and water-blocking and oxygen-blocking material (polyethylene) 26 within mesoporous material (mesoporous silica) 22 and surrounded by the blocking layer (silica dielectric layer) 28.

Embodiment 4

Figure 5:
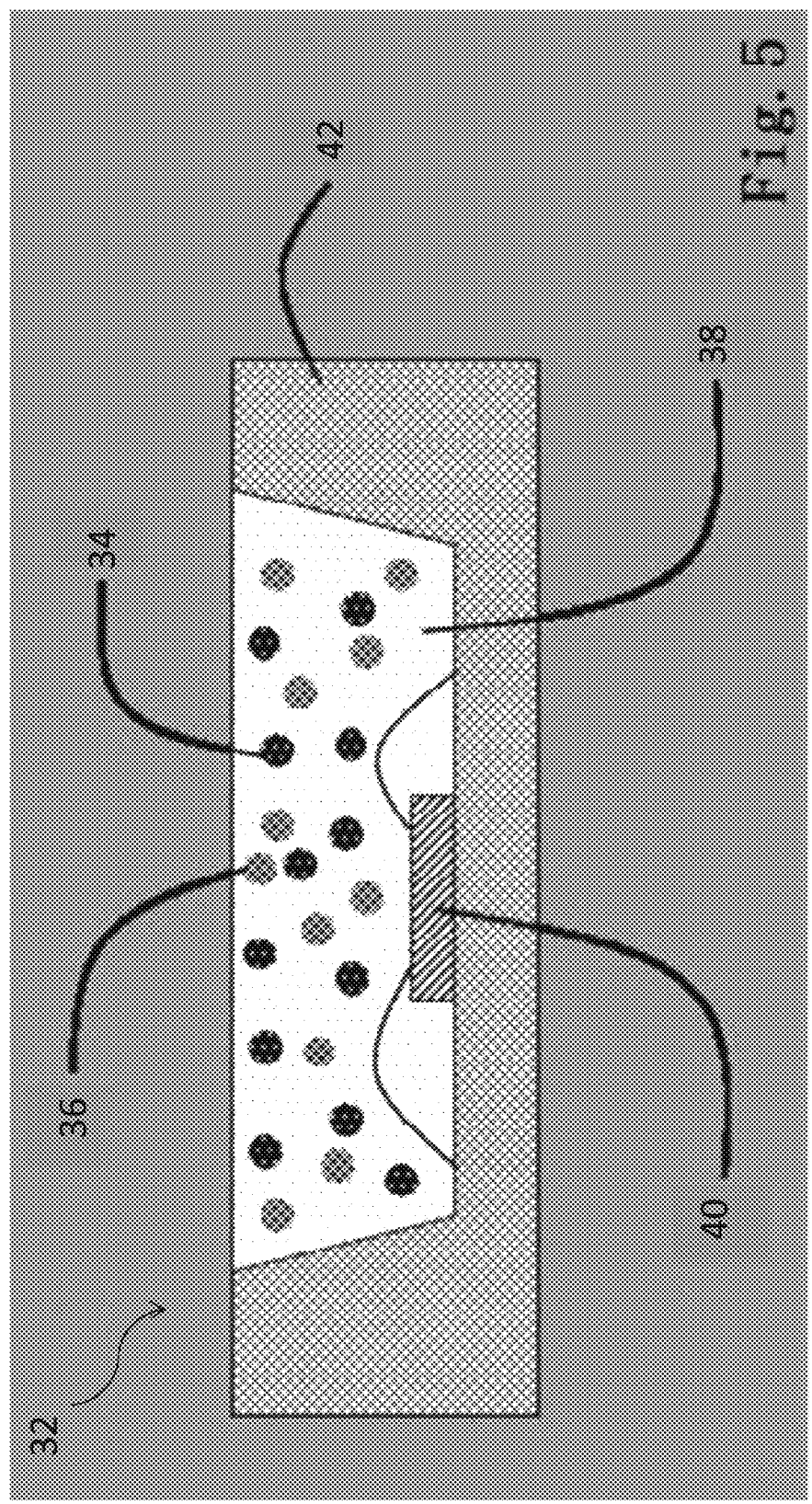
FIG. 5 is a structure diagram of a chip-mounting LED according to embodiment 4.

Referring now to FIG. 5, there is shown a structure diagram of a chip-mounting LED according to a fourth embodiment. The chip-mounting LED 32 shown in FIG. 5 is prepared according to the following method. First, 50 mg quantum dot composite fluorescent particles 34 emitting red lights and 50 mg quantum dot composite fluorescent particles 36 emitting green lights are mixed with 1 g silica gel 38. The silica gel mixture is then quickly and evenly stirred, and subjected to vacuum deaerating. The mixture is then dispensed and coated onto a blue light chip 40 to obtain a white LED 42.

Referring now to FIG. 6, a structure diagram of a backlit LED module according to the fourth embodiment is shown. The backlit LED module 44 shown in FIG. 6 comprises a white light bar obtained from an LED 32 through processes like chip-mounting as described above. Then, the white light bar 32 is integrated into a backlit module 46. The backlit LED module is formed by the backlit module 46, a liquid crystal module 48, and a dodging module 50. The blue lights emitted by the blue light chip are composited with the green lights emitted by green fluorescence particles and the red lights emitted by red fluorescence particles to obtain a blue/green/red tricolor white LED.

Embodiment 5

Referring now to FIG. 7, there is shown a structure diagram of a side-lit LED module according to a fifth embodiment. The slide-lit LED module 52 shown in FIG. 7 is prepared according to the following method. First, 50 mg quantum dot composite fluorescent particles emitting red lights and 50 mg quantum dot composite fluorescent particles emitting green lights are mixed with 1 g silica gel. Then, the silica gel mixture is quickly and evenly stirred, and subjected to vacuum deaerating. Next, the mixture is dispensed and coated on a blue light chip to obtain a white LED, as depicted in FIG. 5.

Referring again to FIG. 7, the white light bar is obtained from an LED 32 through such process like chip-mounting described above. The white light bar is then integrated into a backlit module 46. The backlit LED module comprises a backlit module 46, a liquid crystal module 48, a polarizing module 54, a dodging module 50, a light guiding module 56, and a reflection layer 58. The blue lights emitted by the blue light chip are composited with the green lights emitted by green fluorescence particles and the red lights emitted by red fluorescence particles to obtain a blue/green/red tricolor white LED.

Embodiment 6

Referring now to FIG. 8, there is shown a structure diagram of a chip-mounting LED 60 according to a sixth embodiment. The chip-mounting LED 60 module for lighting depicted in FIG. 8 is prepared using the following method. First, 50 mg quantum dot composite fluorescent particles 62 emitting red lights and 10 mg yellow phosphor powder 64 are mixed with 1 g silica gel 66. The silica gel mixture is quickly and evenly stirred, and subjected to vacuum deaerating. The mixture is then dispensed onto a chip-mounting LED containing a blue light chip 68.

The mixture is then cured under 100-150° C. to obtain a white LED 70. The blue lights emitted by the blue light chip are composited with the yellow lights of the phosphor powder and the red lights emitted by the red fluorescence particles to obtain white lights with optimized red lights, which can greatly improve the color rendering index. The color rendering index R8 of the white LED is above 95, the color rendering index R9 thereof is above 95, and the luminous efficacy thereof can reach above 120 lm/W under a current of 20 mA.

Embodiment 7

The following method describes the preparation of a high-power LED module for lighting according to a seventh embodiment. First, 50 mg quantum dot composite fluorescent particles emitting red lights and 10 mg yellow phosphor powder are mixed with 1 g silica gel. Next, the silica gel mixture is quickly and evenly stirred, and subjected to vacuum deaerating. The mixture is then dispensed onto a chip-mounting (high-power) LED containing a blue light chip. The, the mixture is cured under 100-150° C. to obtain a white LED.

Finally, pins and a gold thread are installed and a polycarbonate lens is covered. Silica gel is injected and filled in before the mixture is cured again under 100-150° C. to obtain a high-power high-luminous efficacy high-color rendering index white LED. The blue lights emitted by the blue light chip are composited with the yellow lights of the phosphor powder and the red lights emitted by the red fluorescence particles to obtain white lights with optimized red lights, which can greatly improve the color rendering index. The color rendering index R8 of the high-power white LED is above 95, the color rendering index R9 thereof is above 95, and the luminous efficacy thereof can reach above 150 lm/W under a current of 20 mA.

Embodiment 8

The following method describes the preparation of quantum dot fluorescent particles according to an eighth embodiment. Mesoporous silica is used as a mesoporous material. The particle size of the mesoporous material can be within the range of 30-60 μm while the mesoporous aperture is 7-8 nm. First, 500 mg of mesoporous silica material is dispersed in 100 mL methylbenzene.

Next, ZnSeS is used as quantum dots and 10 mg of quantum dots are dispersed into 10 mL methylbenzene. Then, the quantum dot solution is dispersed into the mesoporous silica solution, reflowed for 1 hour under 100° C., and stirred quickly. A reflowing device is then removed so that the methylbenzene is volatilized completely in order to obtain quantum dot-mesoporous material powder.

Finally, the foregoing powder is put into a vacuum cavity and a parylene monomer (paraxylene) gas source is slowly pumped therein. The monomer is polymerized and fills in the gaps between the quantum dot and the mesoporous material to obtain quantum dot composite fluorescent particles.

Embodiment 9

The following method describes the preparation of quantum dot fluorescent particles according to a ninth embodiment. Mesoporous titania is used as a mesoporous material. The particle size of the mesoporous material is within the range of 0.05-10 μm while the mesoporous aperture is 2-10 nm. First, 200 mg of mesoporous titania material is dispersed in 30 mL normal hexane.

Next, SrTe is used as quantum dots and 4 mg of quantum dots are dispersed into 5 mL normal hexane. The quantum dot solution is then dispersed into the mesoporous titania solution, heated and reflowed. Then, a reflowing device is removed so that the solvent is volatilized completely and the quantum dots enter the mesoporous titania to obtain quantum dot-mesoporous material powder.

Thereafter, 40 mg polystyrene is dispersed into 20 mL normal hexane and heated until the solids are molten in order to obtain a clear and transparent solution. The quantum dot-mesoporous material powder obtained is added into the polystyrene solution, and quickly stirred. Due to the concentration difference, the polystyrene will enter the mesoporous material to fill in the gaps between the quantum dots and the mesoporous material. After the solvent is completely evaporated, quantum dot composite fluorescent particles are obtained and a titania dielectric layer is grown on the surface of the quantum dot composite fluorescent particles as a blocking layer.

Embodiment 10

The following method describes the preparation of quantum dot fluorescent particles according to a tenth embodiment. First, 2 g mesoporous zinc dioxide with a particle size of 100-1000 μm and a mesoporous aperture of 10-50 nm, and 2 mL of star-shaped nano silver particles are dispersed in 300 mL methylbenzene. The surface of the mesoporous zinc dioxide is soaked and activated, then heated and reflowed. The temperature is insulated for 10 hours. Then, ambient inert gas is added for protection. Next, a reflowing system is removed to vaporize the solvent in order to obtain metal-mesoporous zinc dioxide composite particle powder.

After vaporization of the solvent, the composite particle powder obtained is calcined under 200° C. and ambient inert gas protection before it is re-dispersed in 200 mL methylbenzene. Then, 50 mg of InP quantum dots are dispersed into 20 mL methylbenzene. The quantum dot solution is dispersed into the metal-mesoporous zinc dioxide solution, heated and reflowed. A reflowing device is then removed so that the solvent is volatilized completely. The quantum dots enter the mesoporous zinc dioxide to obtain quantum dot-mesoporous material powder.

Next, 400 mg polycarbonate is dispersed into 150 mL methylbenzene and heated until the solids are molten in order to obtain a clear and transparent solution. The quantum dot-mesoporous material powder obtained is added into the polycarbonate solution and quickly stirred. Meanwhile, due to the concentration difference, the polycarbonate enters the mesoporous material to fill in the gaps between the quantum dots and the mesoporous material. After the solvent is completely evaporated, quantum dot composite fluorescent particles containing nano silver are obtained.

Embodiment 11

The following method describes the preparation of quantum dot fluorescent particles according to an eleventh embodiment. First, 1 g molecular sieve and 0.5 mL round nano platinum particles are dispersed in 100 mL chloroform. The surface of the molecular sieve is soaked and activated, then heated and reflowed. The temperature is insulated for 10 hours and ambient inert gas is then added for protection. Next, a reflowing system is removed to vaporize the solvent in order to obtain white metal-molecular sieve composite particle powder.

The composite particle powder obtained is calcined under 200° C. and ambient inert gas protection then re-dispersed in 40 mL chloroform. Thereafter, 20 mg of $CuInSe_2$ quantum dots are dispersed into 10 mL chloroform. The quantum dot solution is then dispersed into the metal-molecular sieve solution, heated and reflowed. A reflowing device is removed so that the solvent is volatilized completely and the quantum dots enter the molecular sieve to obtain quantum dot-mesoporous material powder.

In the followings step, 200 mg polymethyl methacrylate is dispersed into 100 mL chloroform, heated until the solids are molten in order to obtain a clear and transparent solution. The quantum dot-mesoporous material powder obtained is then added into the polymethyl methacrylate solution and quickly stirred while the polymethyl methacrylate enters the mesoporous material. Due to the concentration difference, the polymethyl methacrylate fills in the gaps between the quantum dots and the mesoporous material. After the solvent is completely evaporated, quantum dot composite fluorescent particles containing nano platinum are obtained. Finally, a boric oxide dielectric layer is grown on the surface of the quantum dot composite fluorescent particles as a blocking layer.

Embodiment 12

The following method describes the preparation of quantum dot fluorescent particles according to a twelfth embodiment. First, 1.5 g mesoporous silica and 0.5 g molybdenum disulfide powder are dispersed in 100 mL normal hexane. The surface of the mesoporous silica is soaked and activated, then heated and reflowed. The temperature is insulated for 10 hours and ambient inert gas is then added for protection. A reflowing system is removed to vaporize the solvent in order to obtain semiconductor-mesoporous silica composite particle powder.

Next, the composite particle powder obtained is calcined under 200° C. and ambient inert gas protection then re-dispersed in 80 mL normal hexane. Thereafter, 10 mg of CdS/ZnSe quantum dots are dispersed into 10 mL normal hexane. The quantum dot solution is dispersed into the semiconductor-mesoporous silica solution, heated and reflowed. Then, a reflowing device is removed so that the solvent is volatilized completely and the quantum dots enter the mesoporous silica to obtain quantum dot-mesoporous material powder.

In the following step, 80 mg oxidized polyethylene wax is dispersed into 100 mL normal hexane and heated until the solids are molten to obtain a clear and transparent solution. The quantum dot-mesoporous material powder obtained is then added into the oxidized polyethylene wax solution and quickly stirred. Due to the concentration difference, the oxidized polyethylene wax enters the mesoporous material to fill in the gaps between the quantum dots and the mesoporous material. After the solvent is completely evaporated, quantum dot composite fluorescent particles containing molybdenum disulfide are obtained. Finally, polystyrene is coated on the surface of the quantum dot composite fluorescent particles as a blocking layer.

Except the foregoing methods, the manner of filling in the water-blocking and oxygen-blocking material may also use an in-situ polymerization method. A polymer, monomer and an initiator enter the quantum dot-mesoporous material and react in-situ to fill in the gaps.

While embodiments of the present invention has been particularly shown and described with reference to certain exemplary embodiments, it will be understood by one skilled in the art that various changes in detail may be effected therein without departing from the spirit and scope of the invention as defined by claims that can be supported by the written description and drawings. Further, where exemplary embodiments are described with reference to a certain number of elements it will be understood that the exemplary embodiments can be practiced utilizing either less than or more than the certain number of elements.

What is claimed is:

1. A quantum dot composite fluorescent particle for use in a LED module, comprising:
   unbound quantum dots distributed within a mesoporous material;
   wherein a water-blocking and oxygen-blocking material separate from the unbound quantum dots fills one or more gaps between the unbound quantum dots and the mesoporous material;
   wherein the mesoporous material has one or more apertures configured to receive the unbound quantum dots; and
   wherein the apertures have a diameter within the range of 2-50 nm.

2. The quantum dot composite fluorescent particle for use in a LED module of claim 1, further comprising one or more metal nanoparticles distributed within the mesoporous material.

3. The quantum dot composite fluorescent particle for use in a LED module of claim 2, wherein the metal nanoparticles are at least one of nano gold, nano silver and nano platinum.

4. The quantum dot composite fluorescent particle for use in a LED module of claim 2, wherein the metal nanoparticles are at least one of a round shape, a triangle shape, a square shape and a star shape.

5. The quantum dot composite fluorescent particle for use in a LED module of claim 1, wherein the water-blocking and oxygen-blocking material is a high polymer.

6. The quantum dot composite fluorescent particle for use in a LED module of claim 5, wherein the high polymer is at least one of oxidized polyethylene wax, polyethylene, polystyrene, poly-p-xylylene, polycarbonate and polymethyl methacrylate.

7. The quantum dot composite fluorescent particle for use in a LED module of claim 1, wherein the mesoporous material has a particle size within the range of 0.05-1000 µm.

8. The quantum dot composite fluorescent particle for use in a LED module of claim 1, wherein the mesoporous material is at least one of a mesoporous silicon dioxide material, a mesoporous titanium dioxide material, a mesoporous zinc dioxide material, a molecular sieve and a metal-organic framework compound.

9. The quantum dot composite fluorescent particle for use in a LED module of claim 1, further comprising a blocking layer, the blocking layer coating an outer surface of the mesoporous material.

10. The quantum dot composite fluorescent particle for use in a LED module of claim 9, wherein the blocking layer is a dielectric layer comprising at least one of silicon dioxide, titanium dioxide and boric oxide.

11. The quantum dot composite fluorescent particle for use in a LED module of claim 9, wherein the blocking layer is a dielectric layer comprising at least one of polystyrene and polyimide.

12. A LED module, comprising:
   a quantum dot composite fluorescent particle having unbound quantum dots distributed within a mesoporous material;
   wherein a water-blocking and oxygen-blocking material separate from the unbound quantum dots fills one or more gaps between the unbound quantum dots and the mesoporous material;
   wherein the mesoporous material has one or more apertures configured to receive the unbound quantum dots;
   wherein the apertures have a diameter within the range of 2-50 nm; and
   a chip having a coating composed of a mixture of the quantum dot composite fluorescent particles and a silica gel.

13. The LED module of claim 12, further comprising one or more metal nanoparticles distributed within the mesoporous material.

14. The LED module of claim 12, further comprising a liquid crystal module, a dodging module and a backlit module.

15. The LED module of claim 14, further comprising a polarizing module, a light guiding module, and a reflection layer.

* * * * *